(12) United States Patent
Yonehara et al.

(10) Patent No.: US 8,871,640 B2
(45) Date of Patent: Oct. 28, 2014

(54) METHOD OF MANUFACTURING SEMICONDUCTOR CHIP

(75) Inventors: Takao Yonehara, Atsugi (JP); Kiyofumi Sakaguchi, Mobara (JP); Nobuo Kawase, Yokohama (JP); Kenji Nakagawa, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 13/262,830

(22) PCT Filed: Apr. 2, 2010

(86) PCT No.: PCT/JP2010/002446
§ 371 (c)(1),
(2), (4) Date: Oct. 3, 2011

(87) PCT Pub. No.: WO2010/116698
PCT Pub. Date: Oct. 14, 2010

(65) Prior Publication Data
US 2012/0028414 A1 Feb. 2, 2012

(30) Foreign Application Priority Data
Apr. 6, 2009 (JP) ................................ 2009-092319

(51) Int. Cl.
*H01L 21/50* (2006.01)
*H01L 21/683* (2006.01)
*H01L 25/065* (2006.01)
*H01L 23/00* (2006.01)

(52) U.S. Cl.
CPC ... *H01L 25/0657* (2013.01); *H01L 2225/06541* (2013.01); *H01L 2221/68318* (2013.01); *H01L 2225/06513* (2013.01); *H01L 2221/6835* (2013.01); *H01L 21/6835* (2013.01); *H01L 2225/06548* (2013.01); *H01L 2924/30105* (2013.01); *H01L 2924/3025* (2013.01); *H01L 24/94* (2013.01); *H01L 2224/16145* (2013.01)
USPC .................... 438/667; 438/109; 257/E21.499

(58) Field of Classification Search
USPC .................................................. 438/109, 667
See application file for complete search history.

(56) References Cited

U.S. PATENT DOCUMENTS 6,638,835 B2 10/2003 Roberds et al.
2003/0108715 A1 6/2003 Roberds et al.
(Continued)

FOREIGN PATENT DOCUMENTS

EP 1432032 A2 6/2004
JP 2001-102523 A 4/2001
(Continued)

*Primary Examiner* — Zandra Smith
*Assistant Examiner* — Damian A Hillman
(74) *Attorney, Agent, or Firm* — Canon USA Inc IP Division

(57) ABSTRACT

A method of manufacturing a semiconductor chip including an integrated circuit and a through-electrode penetrating a semiconductor layer includes the steps of preparing a first substrate including a release layer and a semiconductor layer formed on the release layer; forming an integrated circuit in the semiconductor layer; forming, in the semiconductor layer, a hole or groove having a depth that does not reach the release layer; filling the hole or the groove with an electrical conductor; bonding a second substrate to the semiconductor layer to form a bonded structure; separating the bonded structure at the release layer to prepare the second substrate to which the semiconductor layer is transferred; and removing at least a portion of the reverse surface side of the semiconductor layer exposed by the separation to expose the bottom of the electrical conductor.

4 Claims, 1 Drawing Sheet

(56) References Cited

U.S. PATENT DOCUMENTS

| | | |
|---|---|---|
| 2003/0127428 A1* | 7/2003 | Fujii et al. .................. 216/65 |
| 2004/0077124 A1* | 4/2004 | Ogawa ........................ 438/106 |
| 2009/0001602 A1 | 1/2009 | Chung |

FOREIGN PATENT DOCUMENTS

| | | | | |
|---|---|---|---|---|
| JP | 2003-031778 A | 1/2003 | | |
| JP | 2003-142648 A | 5/2003 | | |
| JP | 2003-229588 A | 8/2003 | | |
| JP | EP1432032 A2 * | 12/2003 | ............ | H01L 25/065 |
| JP | EP1432032 A2 * | 6/2004 | ............ | H01L 25/065 |
| JP | EP 1432032 A2 * | 6/2004 | ............ | H01L 25/065 |
| JP | 2006-019429 A | 1/2006 | | |
| JP | 2006-287118 A | 10/2006 | | |
| JP | 2008-135553 A | 6/2008 | | |
| JP | 2009-010312 A | 1/2009 | | |

* cited by examiner

METHOD OF MANUFACTURING SEMICONDUCTOR CHIP

TECHNICAL FIELD

The present invention relates to a method of manufacturing a semiconductor chip used for a semiconductor memory such as a dynamic random access memory (DRAM) or a flash memory, or a logic integrated circuit (logic IC) such as a central processing unit (CPU) or a digital signal processor (DSP). In particular, the present invention relates to a method of manufacturing a so-called three-dimensionally mounted semi-conductor chip in which a plurality of chips each having an integrated circuit (IC) formed therein are stacked and packaged.

BACKGROUND ART

A method of manufacturing a three-dimensionally mounted IC by transferring, to a handle substrate, a semiconductor layer having a complementary metal oxide semi-conductor (CMOS) circuit formed therein is known. According to an example of such a method, a release layer composed of porous silicon is formed on a surface of a silicon wafer, a semiconductor layer composed of single-crystal silicon is epitaxially grown on the release layer, and a CMOS circuit is then formed in the semiconductor layer.

Subsequently, the semiconductor layer having the CMOS circuit formed therein is bonded to a handle substrate. Separation is conducted at the release layer to transfer the semiconductor layer to the handle substrate. This process is repeated a plurality of times to stack a plurality of semiconductor layers each having the CMOS circuit formed therein on the handle substrate.

Patent Literature 1 discloses a process in which a semiconductor layer having a transistor formed therein is bonded to a handle wafer having a back-side recess, with a polymer film therebetween, and the semiconductor layer is transferred to the handle wafer. This process is then repeated to form stacked transistors.

Patent Literature 2 describes a method of manufacturing a semiconductor chip including a first semiconductor chip and a second semiconductor chip that are arranged so that surfaces each having bonding pads thereon face each other, and a large number of through-silicon vias formed in each of the first and second semiconductor chips.

CITATION LIST

Patent Literature

PTL 1: U.S. Pat. No. 6,638,835
PTL 2: US2009/0001602A1

SUMMARY OF INVENTION

Technical Problem

There is still a room for improvement in the known transfer technology described in Patent Literature 1. That is, the process described in Patent Literature 1 is not a manufacturing method in which a so-called back-end of line is considered.

Furthermore, in the through-silicon via technology described in Patent Literature 2, the reverse surface of a semiconductor wafer is ground to expose a through-electrode (also referred to as "through-silicon via: TSV") embedded in a groove. This technology still has a room for improvement in terms of the cost.

The present invention has been achieved in consideration of the background art and provides a three-dimensionally mounted semiconductor chip at a low cost by an improved transfer technology.

Solution to Problem

The gist of the present invention lies in a method of manufacturing a semiconductor chip including an integrated circuit and a through-electrode penetrating a semi-conductor layer, the method including the steps of preparing a first substrate (semiconductor substrate) including a release layer and a semiconductor layer formed on the release layer; forming an integrated circuit in the semiconductor layer; forming, in the semiconductor layer, a groove having a depth that does not reach the release layer; filling the groove with an electrical conductor; bonding a second substrate to the semiconductor layer to form a bonded structure; separating the bonded structure along the release layer to prepare the second substrate to which the semiconductor layer is transferred; and removing at least a portion of the reverse surface side of the semi-conductor layer exposed by the separation to expose the bottom of the electrical conductor. Thus, a semiconductor chip including the integrated circuit and a through-electrode provided in the groove of the semiconductor layer and penetrating the semi-conductor layer can be manufactured.

Advantageous Effects of Invention

According to the present invention, a groove having a depth that does not reach the release layer is formed in a semiconductor layer, and the groove is filled with an electrical conductor. Subsequently, a semiconductor substrate is separated, and a through-electrode composed of the electrical conductor filing the groove is then exposed. Accordingly, by combining a separation technology of a semiconductor substrate with a through-silicon via technology, it is possible to provide a novel method of manufacturing a three-dimensionally mounted semiconductor chip at a low cost.

DESCRIPTION OF EMBODIMENTS

First Embodiment

Figure 1A:
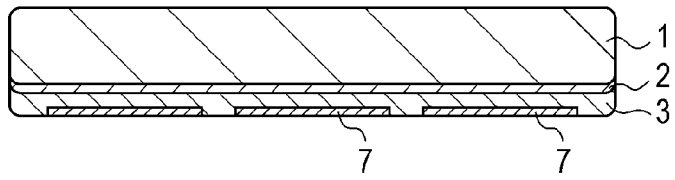
FIG. 1A is a schematic cross-sectional view illustrating a method of manufacturing a semiconductor chip according to an embodiment of the present invention.

As shown in FIG. 1A, a first semiconductor substrate 1 on which a release layer 2 and a semiconductor layer 3 to be transferred are provided in this order is prepared. Furthermore, integrated circuits 7 are formed on the surface side of the semiconductor layer 3. A single-crystal semiconductor substrate such as a bulk silicon wafer can be used as the first semiconductor substrate 1.

A release layer composed of a porous material can be used as the release layer 2. An example thereof is a porous silicon layer obtained by anodizing a surface of a silicon wafer. In conducting anodization, a Pt-type or Nit-type substrate can be used or a substrate can be doped with a $P^+$-type or $N^+$-type impurity so that at least a region to be anodized is $P^+$-type or $N^+$-type. In the present invention, in particular, a $P^+$-type substrate can be used or a substrate can be doped with a $P^+$-type impurity so that at least a region to be anodized is $P^+$-type.

In the present invention, the electrical conductivity may be increased by controlling the $P^+$-type or $N^+$-type region resistivity, and a portion of the porous layer may be left as required so that when chips are formed, the porous layer can function as a shield against noise such as electromagnetic waves.

As the semiconductor layer 3, a single-crystal semiconductor such as single-crystal silicon that is epitaxially grown on a porous layer can be used. The integrated circuits 7 are formed in the epitaxially grown semiconductor layer 3. In forming the integrated circuits 7, active elements such as MOS transistors are formed, and multilayer wiring for connecting the active elements to each other is formed. Herein, each of the integrated circuits can be a semiconductor memory such as a DRAM or a flash memory. For example, in the case of a semiconductor memory, the integrated circuit includes a large number of memory cells, a selective circuit that selects a memory cell, a signal processing circuit for reading a signal from a memory cell and writing a signal to a memory cell, and the like.

Figure 1B:
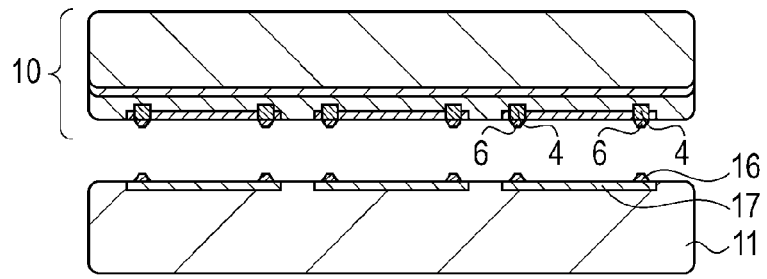
FIG. 1B is a schematic cross-sectional view illustrating the method of manufacturing the semiconductor chip according to the embodiment of the present invention.

As shown in FIG. 1B, after the integrated circuits 7, which include active elements such as MOS transistors and multilayer wiring for connecting the active elements to each other, are formed, holes or grooves 4 serving as through-holes also called "via holes" are formed in the semiconductor layer 3 by reactive ion etching or the like. An insulating film is formed on the inner wall surfaces of the holes or grooves 4 to provide insulating inner wall surfaces, and the holes or grooves are filled with an electrical conductor. In this step, the depth Dt of the grooves 4 is controlled to be smaller than the thickness t3 of the semiconductor layer 3 by adjusting the etching time. Specifically, the grooves 4 are shallowly formed to the extent that the bottoms of the electrically conductive layers in the grooves 4 do not reach the release layer 2 so that the relationship Dt<t3 is satisfied. The thickness t3 of the semiconductor layer 3 can be selected from the range of 1.0 micrometer or more and 20 micrometers or less, and more preferably in the range of 1.0 micrometer or more and 10 micrometers or less. For example, when a CMOS circuit is formed, the thickness t3 of the semiconductor layer 3 is 1.0 micrometer or more and 2.0 micrometers or less. When a memory structure is formed, the thickness t3 of the semiconductor layer 3 is 1.0 micrometer or more and 10.0 micrometers or less, though the thickness t3 varies depending on the capacitance for storing various memory electric charges. The depth Dt of the holes or grooves may be a half or more of the thickness of the semiconductor layer 3 so that a remaining portion having a thickness of one-twentieth or less of the thickness of the semiconductor layer 3 remains at the lower portion of a groove. Specifically, the through-holes are designed so as to satisfy mathematical expression 1. The electrical conductor may be any one of tin (Sn), nickel (Ni), copper (Cu), gold (Au), and aluminum (Al) or an alloy containing at least one of these elements.

$$t3/2 \leq Dt < t3 - (t3/20)$$ [Math.1]

Subsequently, bonding pads 6 composed of solder or gold are formed on the electrical conductors in the grooves 4 as needed. As a result, a structure 10 shown in FIG. 1B is obtained. For the ease of understanding, the grooves 4 and the bonding pads 6 are shown inside each of the integrated circuits 7 in the FIGURE. In general, however, a plurality of through-electrodes and bonding pads are provided in a peripheral portion of an integrated circuit chip.

In the present invention, the through-electrodes are connected to wiring of the integrated circuit of each chip and have a function of electrically connecting to wiring when chips are stacked.

Specifically, the through-electrodes can be a power supply line, an input/output line, a clock signal line, and a ground line.

As shown in FIG. 1B, preferably three or more integrated circuits 17 are formed on the surface side of a second semiconductor substrate 11 which is different from the first substrate composed of a bulk silicon wafer. Herein, the term "integrated circuits 17" refers to integrated circuit portions that are to be formed into chips (dies) in a subsequent step. For example, each of the integrated circuits 17 is a logic IC such as a CPU or a DSP.

Subsequently, bonding pads 16 composed of solder or gold are formed as required. As a result, a structure composed of the second substrate 11 prepared by arranging a plurality of the integrated circuits 17 is obtained, as shown in FIG. 1B. In the present invention, a region including the integrated circuit 17 and the bonding pads 16 is referred to as a "semiconductor chip region".

Subsequently, these structures (the first substrate and the second substrate) face each other so that the integrated circuits 7 and the integrated circuits 17 face each other (so that semiconductor chip regions face each other in the case where the structures have bonding pads), and are then bonded to form a bonded structure.

In this step, the first substrate and the second substrate may be boded with an adhesive therebetween.

The adhesive usable in the present invention may be selected from adhesives that satisfy low viscosity, low impurities, high weather resistance, low outgassing, low shrinkage, heat resistance at 160 degrees Celsius, high adhesive force, low thermal expansion coefficient, high thermal conductivity, and high volume resistivity. Examples of adhesives that satisfy these conditions include acrylic, methacrylic (acrylate), epoxy (acid anhydride curing agent), polyimide, and polyimide-amide (polyimide=nylon modified) adhesives. The adhesive is applied onto a bonding surface (surface of a substrate or a chip) and dried to an extent that a certain degree of tackiness remains. Subsequently, a heat treatment is conducted at a predetermined temperature while applying a predetermined load.

In the present invention, the substrates may be bonded by using a film (hot-melt sheet) functioning as an adhesive instead of or in addition to the adhesive. Examples of such a film usable in the present invention include die bonding films FH series, DF series, and HS series, and films for under-filling UF series, all of which are produced by Hitachi Chemical Co., Ltd.

Alternatively, an anisotropic conductive film or paste, which electrically short-circuits in the thickness direction and insulates between adjacent bonding pads in the lateral direction, may be used as a material functioning as both an adhesive for bonding and electrical conduction.

When the first substrate and the second substrate are bonded to each other, the bonding pads are also bonded in a flip-chip bonding manner to be electrically short-circuited to each other.

When an adhesive is used, the periphery of the flip-chip bonded two semiconductor substrates is temporarily covered with a sealing member composed of, for example, an acrylic resin using a dispenser or the like. The sealing member is cured so that an opening is provided therein. An adhesive having a lower viscosity is introduced into the inner space through the opening and then cured. This technique of filling an adhesive is the same as a known method of filling a liquid crystal material, the method being employed in a method of producing a liquid crystal panel. Alternatively, adhesive particles (adhesive beads) may be dispersed and arranged in an area where the bonding pads are not provided in a surface of one of the semiconductor substrates. When the other semiconductor substrate is bonded to the semiconductor substrate by flip-chip bonding, the adhesive beads may be deformed and cured at the same time. The adhesive interposed between the semiconductor substrates by the above method is used in order to increase the adhesive strength of the two semiconductor substrates without relying only on the adhesive force of the bonding pads when the semi-conductor layer 3 is subsequently separated at the release layer 2. Alternatively, a spin-on-polymer of an organic insulating layer (e.g., polyimide, benzocyclobutene (BCB), or the like) may be applied on a surface so that the thickness of the spin-on-polymer is equal to or lower than the height of bumps provided on the surface, and soft-baking may then be performed at a low temperature to volatilize a volatile solvent. Subsequently, the semiconductor substrates may be bonded while maintaining the tackiness, and post-baking may then be performed to achieve a strong bonding.

Next, an etchant or a high-pressure water stream that does not contain abrasive particles is sprayed onto the side surfaces of the bonded structure. The semiconductor layer 3 is detached from the first semiconductor substrate 1 at the release layer 2. Thus, the first semiconductor substrate 1 is removed, and the semiconductor layer 3 having the integrated circuits 7 formed therein is transferred (also referred to as "moved") from the first semiconductor substrate 1 to another semiconductor substrate 11.

The separation method is not limited to a so-called water jet method described above. Alternatively, a gas jet method in which a high-pressure gas such as nitrogen is sprayed may be employed. In short, it is sufficient to spray a fluid having the function of a wedge. Alternatively, a wedge composed of a solid such as a metal may be hammered between the two semiconductor substrates to mechanically separate the semiconductor substrates. A recess (depression) due to the presence of chamfered portions (beveled portions) of the wafers is formed on a side surface of the bonded structure. Accordingly, when a force vector in a direction in which the two semi-conductor substrates are separated from each other is applied by inserting a solid wedge or a fluid wedge into the recess, the two semiconductor substrates are separated at the release layer 2, which has a low mechanical strength. For example, when separation is performed with a fluid wedge, first, separation of the bonded structure is started using a solid wedge. Subsequently, a fluid wedge is deeply infiltrated in a space so as not to excessively distort and break the wafers, thus completely separating the bonded structure composed of the silicon wafers having a large diameter.

In this step, the release layer 2 after separation may remain at the first semiconductor substrate 1 side, at the semiconductor layer 3 side, the semiconductor layer 3 being transferred to the second semiconductor substrate 11, or both the first semiconductor substrate 1 side and the semiconductor layer 3 side. In particular, when a stacked layer including at least two porous layers composed of porous materials having different porosities is used as the release layer 2, cracks are formed near the interface between the porous layers. Consequently, the semiconductor substrates are separated along the interface between the porous layers. As a result, the thickness of the remaining porous layer becomes uniform over the entire surface of the semiconductor substrate on which integrated circuits are formed, and the remaining porous layer also has a function of protecting the surface after separation.

Figure 1C:
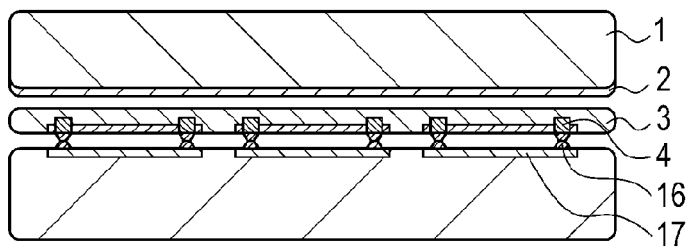
FIG. 1C is a schematic cross-sectional view illustrating the method of manufacturing the semiconductor chip according to the embodiment of the present invention.

The release layer remaining on the reverse surface of the semiconductor layer 3 that is transferred (moved) to the second semiconductor substrate 11 is removed with an etchant. FIG. 1C shows this state after the release layer is removed. Examples of the etchant include a mixed solution containing hydrogen fluoride and hydrogen peroxide and a mixed solution containing hydrogen fluoride, ammonium fluoride, and hydrogen peroxide. Alternatively, the separation may be performed by only etching without using an action of a fluid wedge. In this case, the release layer composed of a porous material may hardly remain on the exposed surface of the transferred semiconductor layer 3 (semiconductor layer 3 after transfer).

Figure 1D:
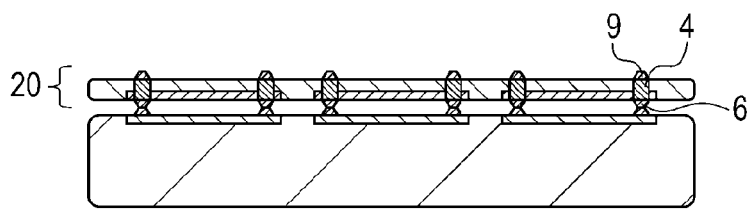
FIG. 1D is a schematic cross-sectional view illustrating the method of manufacturing the semiconductor chip according to the embodiment of the present invention.

When the release layer 2 remains, according to need, the remaining release layer is removed by etching or the like using the above-mentioned mixed solution to expose the reverse surface of the semiconductor layer 3. At least portions (portions to be formed into bonding pads) on the reverse surface side of the semiconductor layer 3 are etched until the electrical conductor in the grooves 4 functioning as through-electrodes are exposed. After the bottoms of the electrical conductor are exposed, bonding pads 9 composed of solder, gold, or the like are formed as required. In this step, instead of the etching or in combination with the etching, at least portions (portions to be formed into the bonding pads) on the reverse surface side of the semiconductor layer 3 may be polished. Thus, as shown in FIG. 1D, a thinned structure 20 including integrated circuit chips having a reduced thickness is obtained. Alternatively, as described above, a portion of the release layer may be left according to need so that the release layer functions as a shield that protects a chip from noise such as electromagnetic waves. In this case, only parts of the release layer forming the through-electrodes are selectively removed. In order to selectively remove the release layer, a mask may be formed in parts of the release layer to be left, and etching may be selectively performed. Alternatively, an etchant may be selectively supplied to parts to be etched by an ink jet method or the like.

Since the first semiconductor substrate 1 has been detached and removed from the semiconductor layer 3 bonded to the second semiconductor substrate 11, the thickness of the semiconductor layer 3 has been reduced. Accordingly, the electrical conductor filled in the grooves 4 can be exposed by a method other than etching, for example, by polishing the reverse surface (exposed surface) of the semiconductor layer 3.

Figure 1E:
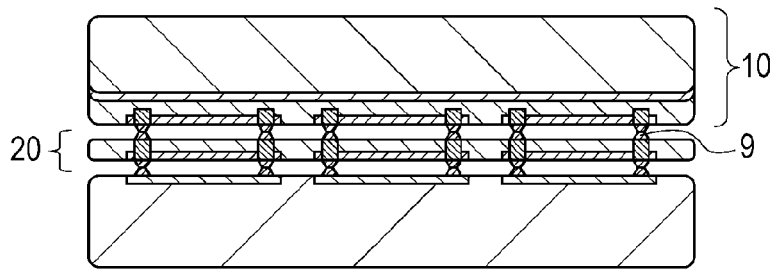
FIG. 1E is a schematic cross-sectional view illustrating the method of manufacturing the semiconductor chip according to the embodiment of the present invention.
Figure 1F:
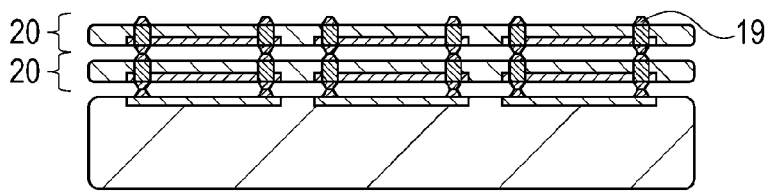
FIG. 1F is a schematic cross-sectional view illustrating the method of manufacturing the semiconductor chip according to the embodiment of the present invention.

A structure 10 is prepared by the same process as that described above. A semi-conductor layer 3 is further bonded on the structure shown in FIG. 1D. As a result, a bonded structure shown in FIG. 1E is prepared. Subsequently, the bonded structure is again separated in the same manner. As a result, a structure shown in FIG. 1F is prepared. This structure in which integrated circuits are stacked at the wafer level is diced between integrated circuits to independently separate from each other, thereby obtaining three-dimensionally mounted semiconductor chips.

The bonding step and the separation step are further repeated to stack four layers or more, and furthermore, eight layers or more of chips each having the integrated circuit 7.

Second Embodiment

A method suitable for a case where chips are stacked at the wafer level has been descried in the first embodiment.

In this embodiment, in the state shown in FIG. 1B, a temporarily used support substrate (also referred to as "handle substrate") is used as a third substrate instead of the semiconductor substrate. Chips are formed and then stacked, thus obtaining a three-dimensionally mounted semiconductor chip.

In this embodiment, a support substrate 11 which is the third substrate is a support substrate to which a semiconductor layer 3 is temporarily transferred, and the semi-conductor layer 3 is then transferred from the third substrate to another substrate (mounting substrate), which is the final transfer destination. The third substrate may be a silicon wafer, a glass plate, a resin film, a metal film, or the like. Integrated circuits 17 need not be formed in the third substrate. Bonding pads 6 or 16 are also not necessary.

In order to use the third substrate as a temporary support substrate, it is necessary that the semiconductor layer 3 that is temporarily transferred to the third substrate become separable from the third substrate. For this purpose, a bonding layer functioning as a release layer is formed in advance on at least one of the surface of the support substrate 11 which is the third substrate and the surface of the semiconductor layer 3. For example, a resin material (e.g., resist) that can be dissolved or decomposed by etching or ashing can be used as the bonding layer. Alternatively, an adhesive or an adhesive tape, the adhesive force of which is decreased by heat, ultraviolet light, or the like, may also be used.

In the present invention, for example, a UV-releasable adhesive layer can be used as the bonding layer. The UV-releasable adhesive layer is a material that becomes separable by a certain treatment. This treatment means a treatment that causes decomposition of the release layer or a decrease in the bonding strength thereof. For example, a transparent substrate such as a glass plate or a resin film is used as the third substrate, and UV light is applied from the substrate side to cause decomposition of the UV-releasable adhesive layer or a decrease in the bonding strength thereof. Thus, the semiconductor layer can be separated from the third substrate and transferred to another substrate (mounting substrate). Alternatively, the semiconductor layer 3 may be divided into a plurality of regions by dicing or the like. Among the plurality of regions, some of the regions may be selectively (locally) transferred. When a transfer is locally performed in this manner, for example, a UV laser beam (having a UV wavelength in the range of 300 to 400 nm, for example) may be focused on a small spot and scanned.

Alternatively, the entire surface of the semiconductor layer 3 may be irradiated with light, and thus the whole semiconductor layer 3 may be separated from the third substrate at one time and then transferred.

Examples of a UV-releasable adhesive material include a material in which cross-linking is cleaved by irradiation of UV energy, and a material containing capsules that form foams by absorbing UV light. An example of a thermal releasable adhesive material is REVALPHA (trade name, manufactured by Nitto Denko Corporation).

As in the structure shown in FIG. 1A, a release layer 2 and a semiconductor layer 3 to be transferred are formed on a surface of a semiconductor substrate 1. Furthermore, integrated circuits 7 are formed on the surface side of the semiconductor layer 3.

As the semiconductor layer 3, a single-crystal semiconductor such as single-crystal silicon that is epitaxially grown on a porous layer may be used. The integrated circuits 7 are formed in the epitaxially grown semiconductor layer 3.

In order to form the integrated circuits 7, active elements such as MOS transistors are formed, and multilayer wiring for connecting the active elements to each other is formed. Subsequently, grooves 4 serving as through-holes also called "via holes" are formed in the semiconductor layer 3. An insulating film is formed on the inner wall surfaces of the grooves 4 to provide insulating inner wall surfaces, and the grooves 4 are filled with an electrical conductor functioning as through-electrodes. In this case, the depth Dt of the grooves 4 and the thickness t3 of the semiconductor layer 3 can satisfy the relationship described above.

Subsequently, the semiconductor layer 3 is bonded to the support substrate which is the third substrate to form a bonded structure.

Next, the bonded structure is separated into two parts at the release layer 2. Thus, the semiconductor layer 3 having the integrated circuits 7 formed therein is transferred to the support substrate which is the third substrate.

Subsequently, the reverse surface of the semiconductor layer 3 is etched or polished until the electrical conductor in the grooves 4, the electrical conductor being formed into through-electrodes, is exposed. After the electrical conductor is exposed, according to need, bonding pads 9 composed of solder, gold, or the like are formed. Thus, a thinned structure 20 which has the same structure as shown in FIG. 1D and which includes integrated circuit chips having a reduced thickness is obtained. Dicing is then conducted so that individual integrated circuits (or individual integrated circuit regions) are independently separated from each other. Thus, a plurality of semi-conductor chips are prepared.

Each of the semiconductor chips thus prepared is separated at the release layer, and transferred on a mounting substrate which as another substrate. Thus, three or more layers are stacked on the mounting substrate. In this step, the chips are stacked so that the through-electrodes are overlapped, and packaged. As a result, a three-dimensionally mounted semiconductor chip can be obtained.

The mounting substrate may be composed of, for example, a metal, a ceramic, or an insulating sheet having metal wiring thereon. In all the drawings, the dimension in the vertical direction is enlarged. However, in reality, the chip size (the length in the horizontal direction in the drawings) is significantly larger than the thickness (the length in the vertical direction in the drawings).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-092319, filed Apr. 6, 2009, which is hereby incorporated by reference herein in its entirety.

The invention claimed is:

1. A method of manufacturing a semiconductor chip including an integrated circuit and a through-electrode penetrating a semiconductor layer, the method comprising the steps of:
preparing a first substrate including a release layer and a semiconductor layer formed on the release layer;
forming an integrated circuit in the semiconductor layer;
forming, in the semiconductor layer, a hole or groove having a depth which may be a half or more of a thickness of the semiconductor layer such that a remaining portion having a thickness of one-twentieth or more of the thickness of the semiconductor layer remains at the lower portion of the hole or groove;
filling the hole or the groove with an electrical conductor;
bonding a second substrate to the semiconductor layer to form a bonded structure;
separating the bonded structure at the release layer to prepare the second substrate to which the semiconductor layer is transferred; and
removing at least a portion of the reverse surface side of the semi-conductor layer exposed by the separation so as to expose the bottom of the electrical conductor,
wherein the second substrate includes an integrated circuit and a bonding pad, and the semiconductor chip is stacked on the integrated circuit of the second substrate so that the through-electrode formed on a surface of the semiconductor layer of the first substrate is electrically connected to the bonding pad of the second substrate to form a three-dimensionally mounted semiconductor chip.

2. The method according to claim 1, wherein the second substrate is a wafer prepared by arranging a plurality of semiconductor chip regions each including the integrated circuit and the bonding pad, the first substrate is a wafer prepared by arranging a plurality of semi-conductor chip regions each including the integrated circuit and the electrical conductor functioning as the through-electrode that are formed in the semiconductor layer, the first substrate and the second substrate are bonded to each other so that the semiconductor chip regions face each other to form the bonded structure, and the method further includes a step of dicing the wafers in which semi-conductor chips each including the integrated circuit are stacked so that individual integrated circuit regions are independently separated from each other to form three-dimensionally mounted semiconductor chips.

3. A method of manufacturing a semiconductor chip including integrated circuits and through-electrodes penetrating a semiconductor layer, the method comprising the steps of:
preparing a first substrate including a release layer and a semiconductor layer formed on the release layer;
forming integrated circuits in the semiconductor layer;
forming, in the semiconductor layer, holes or grooves having a depth which may be a half or more of a thickness of the semiconductor layer such that a remaining portion having a thickness of one-twentieth or more of the thickness of the semiconductor layer remains at the lower portion of the hole or groove;
filling the holes or the grooves with an electrical conductor to form through-electrodes;
bonding a third substrate serving as a temporary support substrate to the semiconductor layer to form a bonded structure;
separating the bonded structure at the release layer to prepare the third substrate to which the semiconductor layer is transferred;
dicing the semiconductor layer that has been transferred to the third substrate so that the individual integrated circuits are independently separated from each other; and
stacking diced semiconductor chips each including the integrated circuit so that the through-electrodes are overlapped each other to form a three-dimensionally mounted semiconductor chip.

4. A method of manufacturing a semiconductor chip including an integrated circuit and a through-electrode penetrating a semiconductor layer, the method comprising the steps of:
preparing a first substrate including a release layer and a semiconductor layer formed on the release layer;
forming an integrated circuit in the semiconductor layer;
forming, in the semiconductor layer, a hole or groove;
filling the hole or the groove with an electrical conductor;
bonding a second substrate to the semiconductor layer to form a bonded structure;
separating the bonded structure at the release layer to prepare the second substrate to which the semiconductor layer is transferred; and
removing at least a portion of the reverse surface side of the semi-conductor layer exposed by the separation so as to expose the bottom of the electrical conductor,
wherein the second substrate includes an integrated circuit and a bonding pad, and the semiconductor chip is stacked on the integrated circuit of the second substrate so that the through-electrode formed on a surface of the semiconductor layer of the first substrate is electrically connected to the bonding pad of the second substrate to form a three-dimensionally mounted semiconductor chip.

* * * * *